(12) United States Patent
Zhang et al.

(10) Patent No.: US 10,141,458 B2
(45) Date of Patent: Nov. 27, 2018

(54) VERTICAL GATE GUARD RING FOR SINGLE PHOTON AVALANCHE DIODE PITCH MINIMIZATION

(71) Applicant: OMNIVISION TECHNOLOGIES, INC., Santa Clara, CA (US)

(72) Inventors: Bowei Zhang, Fremont, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 149 days.

(21) Appl. No.: 15/216,049

(22) Filed: Jul. 21, 2016

(65) Prior Publication Data

US 2018/0026147 A1    Jan. 25, 2018

(51) Int. Cl.
| | |
|---|---|
| *H01L 31/02* | (2006.01) |
| *H01L 27/14* | (2006.01) |
| *H01L 31/10* | (2006.01) |
| *G04F 10/00* | (2006.01) |
| *H04N 5/374* | (2011.01) |
| *H01L 31/0224* | (2006.01) |
| *H01L 31/107* | (2006.01) |
| *H01L 31/0216* | (2014.01) |

(Continued)

(52) U.S. Cl.
CPC .... *H01L 31/022416* (2013.01); *G04F 10/005* (2013.01); *H01L 27/1462* (2013.01); *H01L 27/1463* (2013.01); *H01L 27/1464* (2013.01); *H01L 27/14634* (2013.01); *H01L 27/14643* (2013.01); *H01L 31/02027* (2013.01); *H01L 31/02161* (2013.01); *H01L 31/107* (2013.01); *H04N 5/374* (2013.01); *H04N 5/378* (2013.01)

(58) Field of Classification Search
CPC ......... H01L 31/022416; H01L 27/1462; H01L 27/1463; H01L 27/14634; H01L 27/1464; H01L 27/14643; H01L 31/02027; H01L 31/02161; H01L 31/107; H01L 31/1075; G04F 10/005; H04N 5/374; H04N 5/378
USPC ............................................. 257/292; 438/48
See application file for complete search history.

(56) References Cited

U.S. PATENT DOCUMENTS

| | | | |
|---|---|---|---|
| 2010/0148040 A1* | 6/2010 | Sanfilippo ........... | H01L 31/1075 250/214.1 |
| 2010/0271108 A1* | 10/2010 | Sanfilippo ............. | H01L 31/107 327/502 |

(Continued)

*Primary Examiner* — Didarul Mazumder
(74) *Attorney, Agent, or Firm* — Christensen O'Connor Johnson Kindness PLLC

(57) ABSTRACT

A photon detection device includes a single photon avalanche diode (SPAD) including a multiplication junction defined at an interface between n doped and p doped layers of the SPAD in a first region of a semiconductor layer. A vertical gate structure surrounds the SPAD in the semiconductor layer to isolate the SPAD in the first region from a second region of the semiconductor layer on an opposite side of the vertical gate structure. The SPAD laterally extends within the first region of semiconductor layer to the vertical gate structure. An inversion layer is generated in the SPAD around a perimeter of the SPAD proximate to the vertical gate structure in response to a gate bias voltage coupled to the vertical gate structure. The inversion layer isolates the SPAD from the second region of the semiconductor layer on the opposite side of the vertical gate structure.

17 Claims, 4 Drawing Sheets

(51) Int. Cl.
*H01L 27/146* (2006.01)
*H04N 5/378* (2011.01)

(56) References Cited

U.S. PATENT DOCUMENTS

| | | | |
|---|---|---|---|
| 2010/0301442 A1* | 12/2010 | Iwai | H01L 31/022416 |
| | | | 257/437 |
| 2012/0261729 A1 | 10/2012 | Finkelstein et al. | |
| 2013/0099346 A1* | 4/2013 | Choong | H01L 27/1446 |
| | | | 257/437 |
| 2014/0291481 A1* | 10/2014 | Zhang | H04N 5/361 |
| | | | 250/208.1 |
| 2015/0200222 A1* | 7/2015 | Webster | H01L 31/107 |
| | | | 250/208.1 |
| 2015/0340391 A1* | 11/2015 | Webster | H01L 27/14605 |
| | | | 348/322 |

* cited by examiner

VERTICAL GATE GUARD RING FOR SINGLE PHOTON AVALANCHE DIODE PITCH MINIMIZATION

BACKGROUND INFORMATION

Field of the Disclosure

The present invention relates generally to photodetectors, and more specifically, the present invention is directed to single photon avalanche diode photon sensing systems.

Background

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these sensors.

One type of photodetector that may be used in an image sensor or in a light detector is a single-photon avalanche diode (SPAD). A SPAD (also sometimes referred to as a Geiger-mode avalanche photodiode (G-APD)) is a solid-state photodetector capable of detecting a low intensity signal, such as low as a single photon. SPAD imaging sensors are semiconductor photosensitive devices made up of an array of SPAD regions that are fabricated on a silicon substrate. The SPAD regions produce an output pulse when struck by a photon. The SPAD regions have a pn junction that is reverse biased above the breakdown voltage such that a single photo-generated carrier can trigger an avalanche multiplication process that causes current at the output of the photon detection cell to reach its final value quickly. This avalanche current continues until a quenching element is used to quench the avalanche process by reducing the bias voltage. The photon signal received by the image sensor can be detected and measured with support circuitry to count output pulses from the SPAD regions within a window of time to measure the intensity of the incident light, time the arrival of the incident light, provide optical communications, or a variety of other optical applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
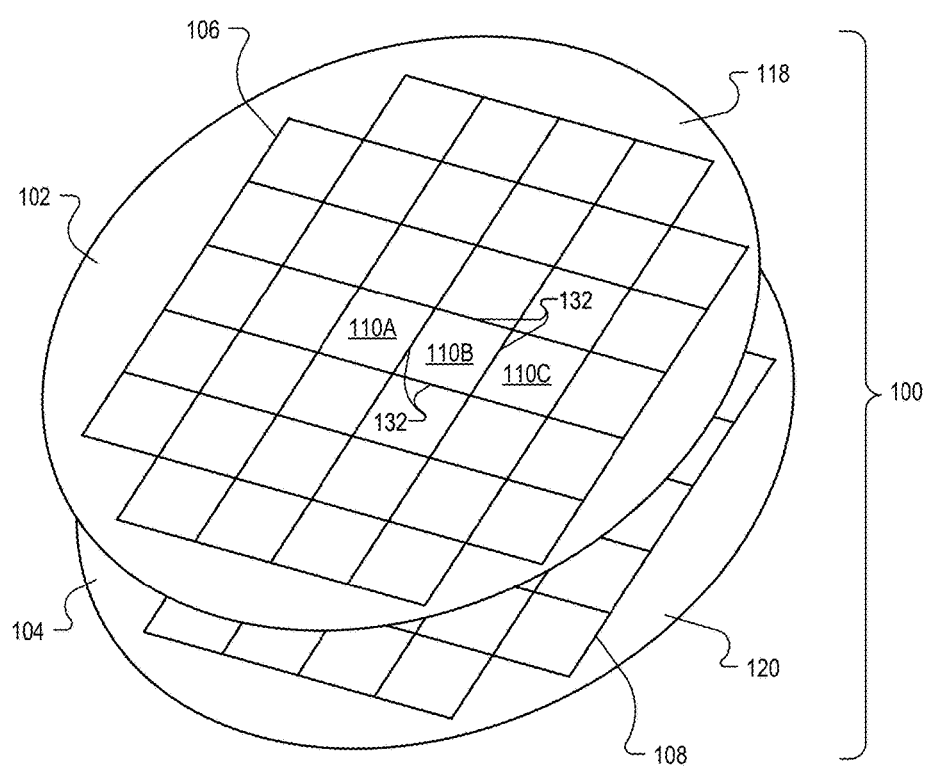
FIG. 1 is an exploded view of one example of stacked semiconductor device wafers with integrated circuit dies of an example single photon avalanche diode (SPAD) photon sensing system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale. Furthermore, the particular features, structures, or characteristics may be combined in any suitable manner in one or more embodiments. Directional terminology such as "top", "down", "above", "below" are used with reference to the orientation of the figure(s) being described.

As will be discussed, examples in accordance with the teaching of the present invention describe a photon sensing system including single photon avalanche diodes (SPADs) with biased vertical gate structures providing guard ring isolation in accordance with the teachings of the present invention. With the biased vertical gate structures, the SPADs have a smaller pitch compared with traditional doping guard ring designs, which therefore provide an improved fill factor for the SPADs and increased miniaturization. In addition, the biased vertical gate structures disclosed herewith also provide improved low dark count rate (DCR) and better edge protection compared to traditional SPAD guard ring designs.

To illustrate, FIG. 1 is an exploded view of one example of stacked semiconductor device wafers 102 and 104 with integrated circuit dies of an example single photon avalanche diode (SPAD) photon sensing system 100 in accordance with the teachings of the present invention. In various examples, semiconductor device wafers 102 and 104 may include silicon, gallium arsenide, or other suitable semiconductor materials. In the illustrated example, device wafer 102 is a top sensor chip that includes a photon detection array 106 having a plurality of photon detection devices including SPADs 100A, 110B, 100C, etc., in accordance with the teachings of the present invention. Device wafer 102 is stacked with device 104, which includes support circuitry 108 disposed in a second semiconductor layer 120 and coupled to the photon detection array 106 to support operation of the photon detection array 106. As will be discussed in more detail below, in some examples, each SPAD 100A, 110B, 110C, etc., is isolated in a first semiconductor layer 118 from one another with biased vertical gate structures 132, while support circuitry 108 disposed in device wafer 104 may implemented in an application specific integrated circuit (ASIC) die with complementary metal oxide semiconductor (CMOS) circuitry including for example but not limited to quenching circuitry, counter circuitry, time to digital converter (TDC) circuitry, readout circuitry, control circuitry, functional logic and other associated support circuitry that are fabricated using standard CMOS processes to support operation of photon detection array 106 in accordance with the teachings of the present invention. The placement of the support circuitry 108 on the separate bottom device wafer 104 allows for a very high fill factor in the SPAD photon detection array 106 on the top device wafer 102. Furthermore, since device wafer 102 is formed separately from device wafer 104, custom fabrication processes may be utilized to optimize the formation of the SPAD 110A, 110B, 110C, etc., regions in the SPAD photon detection array 106 on device wafer 102, while traditional CMOS processes may be retained when forming the CMOS support circuitry 108 on the device wafer 104 in accordance with the teachings of the present invention.

Figure 2:
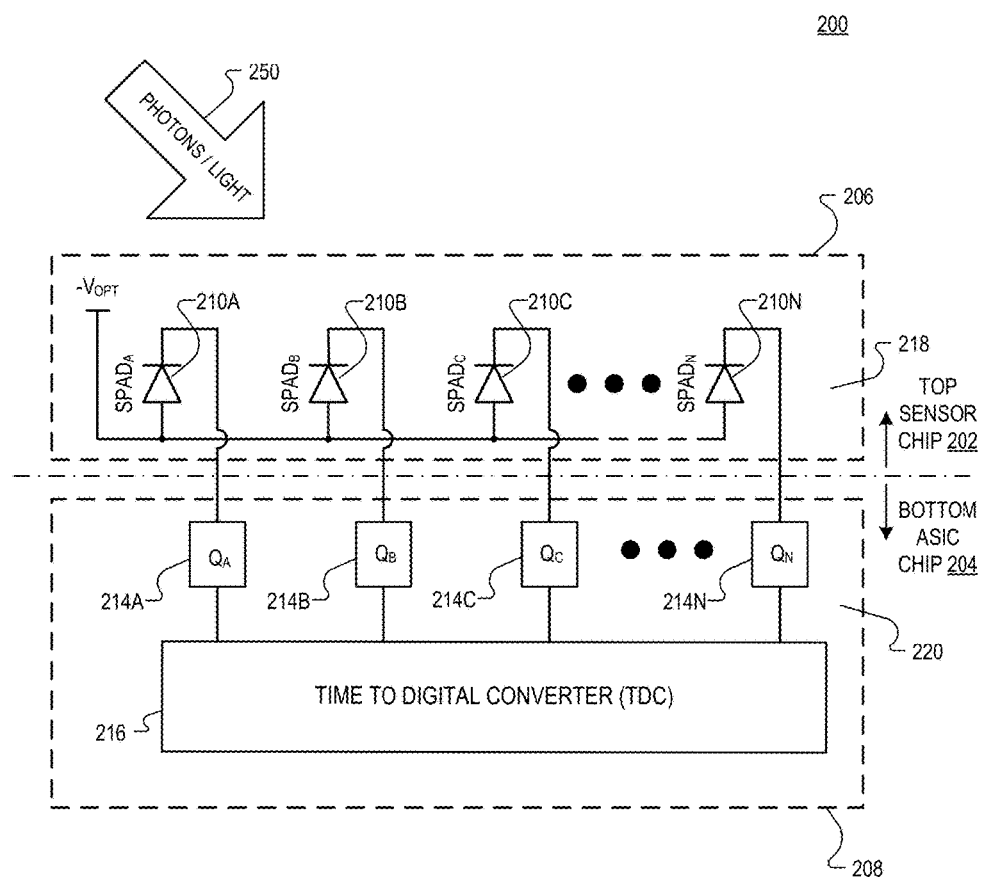
FIG. 2 is a circuit diagram illustrating one example of a stacked chip system including a photon detection array of SPADs in a top sensor chip that is stacked with a bottom application specific integrated circuit chip (ASIC) with support circuitry in accordance with the teachings of the present invention.

FIG. 2 is a circuit diagram illustrating one example of a stacked chip photon sensing system 200 including a photon detection array 206 of SPADs in a top sensor chip 202 that is stacked with a bottom application specific integrated circuit chip (ASIC) 204 with support circuitry 208 in accordance with the teachings of the present invention. It is appreciated that stacked chip photon sensing system 200 may be one example of an implementation of stacked chip photon sensing system 100 of FIG. 1, and that similarly named and numbered elements referenced below are coupled and function similar to as described above. In the depicted example, photon sensing system 200 includes a photon detection array 206 with SPAD photon detection devices including $SPAD_A$ 210A, $SPAD_B$ 210B, $SPAD_C$ 210C, . . . $SPAD_N$ 210N disposed in a first semiconductor layer 218 of top sensor chip 202. In the example depicted in FIG. 2, support circuitry 208 disposed in a second semiconductor layer 220 of a bottom ASIC chip 204 is coupled to photon detection array 206 to support operation of $SPAD_A$ 210A, $SPAD_B$ 210B, $SPAD_C$ 210C, . . . $SPAD_N$ 210N. For instance, in the depicted example, the support circuitry 208 in bottom ASIC chip 204 includes quenching circuitry $Q_A$ 214A, $Q_B$ 214B, $Q_C$ 214C, . . . $Q_N$ 214N coupled to each respective $SPAD_A$ 210A, $SPAD_B$ 210B, $SPAD_C$ 210C, . . . $SPAD_N$ 210N. In the example, support circuitry 208 includes other circuitry coupled quenching circuitry $Q_A$ 214A, $Q_B$ 214B, $Q_C$ 214C, . . . $Q_N$ 214N such as for example time to digital converter (TDC) circuitry 216 to support operation of $SPAD_A$ 210A, $SPAD_B$ 210B, $SPAD_C$ 210C, . . . $SPAD_N$ 210N. It is appreciated of course that support circuitry 208 may include other types of circuitry such as for example counter circuitry, timing circuitry, readout circuitry, control circuitry, functional logic, or other well-known SPAD support circuitry, which are not shown or described in detail to avoid obscuring certain aspects in accordance with the teachings of the present invention. In addition, it is noted that the example depicted in FIG. 2, $SPAD_A$ 210A, $SPAD_B$ 210B, $SPAD_C$ 210C, . . . $SPAD_N$ 210N are illustrated as being arranged in a single row. However, in other examples, it is appreciated that pixels of the pixel array may be arranged into a single column, or into a two-dimensional array of columns and rows.

In the depicted example, it is noted that the anode of each $SPAD_A$ 210A, $SPAD_B$ 210B, $SPAD_C$ 210C, . . . $SPAD_N$ 210N is coupled to a negative operational voltage $-V_{OPT}$, and that the cathode of each $SPAD_A$ 210A, $SPAD_B$ 210B, $SPAD_C$ 210C, . . . $SPAD_N$ 210N is coupled to quenching circuitry $Q_A$ 214A, $Q_B$ 214B, $Q_C$ 214C, . . . $Q_N$ 214N. When the SPADs of photon detection array 206 are illuminated with photons/light 250, the resulting output pulses from $SPAD_A$ 210A, $SPAD_B$ 210B, $SPAD_C$ 210C, . . . $SPAD_N$ 210N, and quenching circuitry $Q_A$ 214A, $Q_B$ 214B, $Q_C$ 214C, . . . $Q_N$ 214N, are detected with TDC circuitry 216 to measure and/or time the arrival of incident photons/light 250 in accordance with the teachings of the present invention. In the illustrated example, each $SPAD_A$ 210A, $SPAD_B$ 210B, $SPAD_C$ 210C, . . . $SPAD_N$ 210N is reverse biased above the breakdown voltage of each $SPAD_A$ 210A, $SPAD_B$ 210B, $SPAD_C$ 210C, . . . $SPAD_N$ 210N. In response to a single photogenerated carrier from incident photons/light 250, an avalanche multiplication process is triggered that causes an avalanche current at the output of each $SPAD_A$ 210A, $SPAD_B$ 210B, $SPAD_C$ 210C, . . . $SPAD_N$ 210N. This avalanche current self-quenches in response to a voltage drop that is developed across the quenching element (e.g., quenching circuitry $Q_A$ 214A, $Q_B$ 214B, $Q_C$ 214C, . . . $Q_N$ 214N), which causes the bias voltage across the SPAD to drop. After the quenching of the avalanche current, the voltage across the SPAD recovers to above the bias voltage and then the SPAD is ready to be triggered again. The resulting output pulse of each quenching circuit $Q_A$ 214A, $Q_B$ 214B, $Q_C$ 214C, . . . $Q_N$ 214N is received by TDC circuitry 216, which can measure the time of arrival of each photon of incident photons/light 250 in accordance with the teachings of the present invention.

Conventional SPAD designs that incorporate SPADs on the same chips as the SPAD support circuitry fabricated using a standard CMOS process suffer from reduced fill factor on the imaging plane due to the area occupied by the CMOS circuits themselves. Accordingly, one advantage of implementing a stacked chip structure in accordance with the teachings of the present invention is that with the SPADs on the top chip and with the support circuitry on a separate bottom chip, the fill factor of the SPAD imaging array on the top chip does not need to be reduced in order to provide room to accommodate the CMOS circuitry on the same chip in accordance with the teachings of the present invention.

Figure 3:
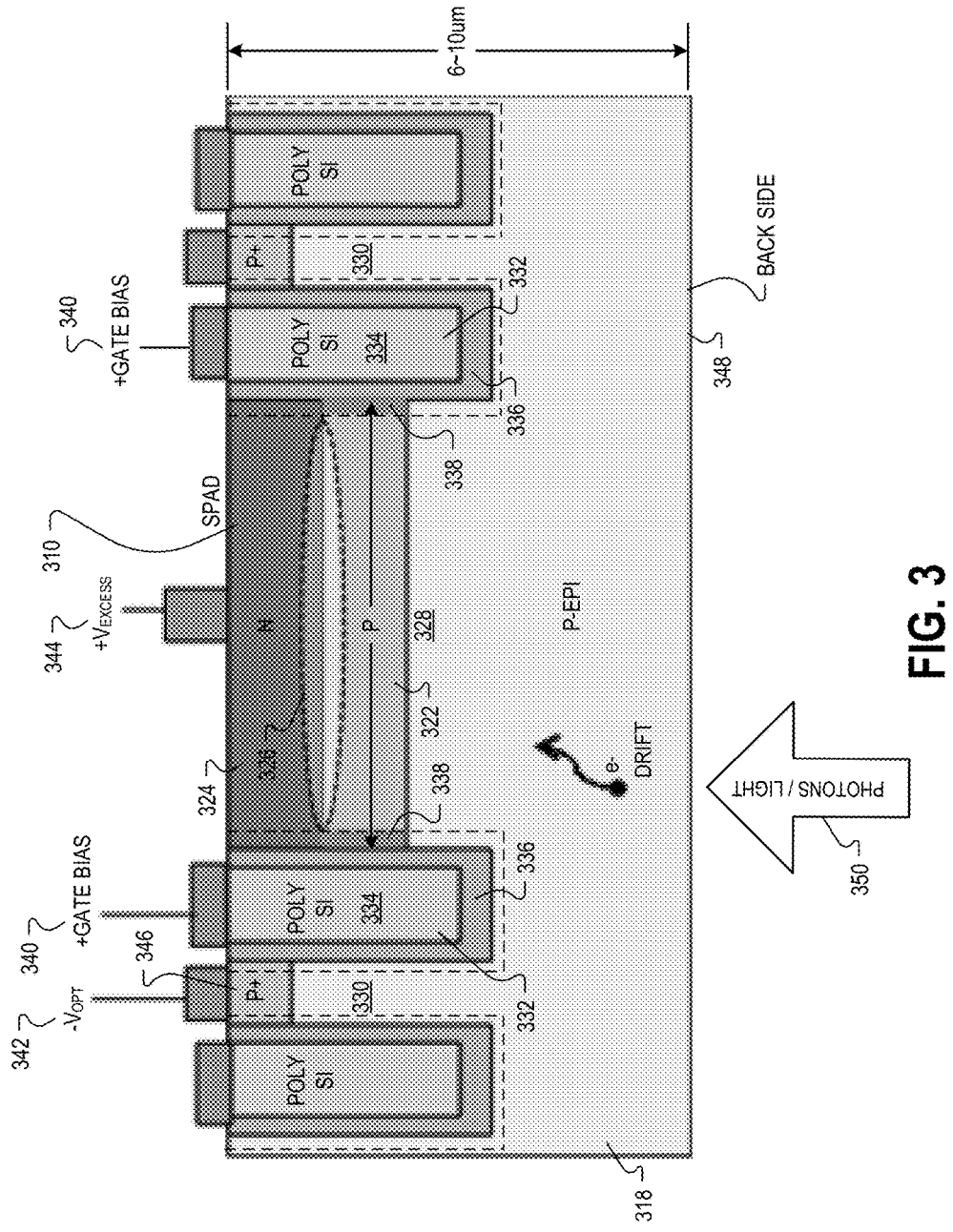
FIG. 3 is a cross-sectional view of one example of a photon detection device implemented in a semiconductor device wafer of a stacked chip system including a SPAD surrounded by vertical gate structures to provide guard ring isolation with reduced pitch and increased packing density in accordance with the teachings of the present invention.

FIG. 3 is a cross-sectional view of one example of a photon detection device implemented in a semiconductor device wafer of a stacked chip system including a SPAD 310 surrounded by vertical gate structures 332 to provide guard ring isolation with reduced pitch and increased packing density in accordance with the teachings of the present invention. It is appreciated that SPAD 310 of FIG. 3 may be one example of an implementation of SPADs 110A, 110B, 110C of FIG. 1, or of $SPAD_A$ 210A, $SPAD_B$ 210B, $SPAD_C$ 210C, ... $SPAD_N$ 210N of FIG. 2, and that similarly named and numbered elements referenced below are coupled and function similar to as described above. The example photon detection device depicted in FIG. 3 includes a SPAD 310 that is disposed in a first region 328 of a first semiconductor layer 318. In one example, the first semiconductor layer 318 is a p doped epitaxial layer (i.e., P-EPI) of silicon, which as will be discussed in greater detail below is biased with a high negative operational voltage $-V_{OPT}$ 342 through a p+ doped region 346 as shown. SPAD 310 includes a multiplication junction 326 defined at an interface between an n doped layer 324 and a p doped layer 322 in the first region 328 of the first semiconductor layer 318.

In the depicted example, biased vertical gate structures 332 are disposed in the first semiconductor layer 318 proximate to the SPAD 310 as shown. The biased vertical gate structures 332 surround the SPAD 310 to isolate the SPAD 310 in the first region 328 of the first semiconductor layer 318 from second regions 330 of the first semiconductor layer 318 on opposite sides of the vertical gate structures 332 as shown. As shown in the illustrated example, SPAD 310, including for example p doped layer 322, laterally extends within the first region 328 of first semiconductor layer 318 all the way to the vertical gate structures 332. As such, a depletion layer 338 (illustrated in FIG. 3 with dashed lines) is generated in the SPAD 310 around a perimeter of the SPAD 310 proximate to or at the vertical gate structures 332 in response to a positive gate bias voltage +GATE BIAS 340 coupled to the vertical gate structure 332. In the illustrated example, the depletion layer 338 surrounding the vertical gate structures 332 as shown is generated in the p doped layer of the SPAD 310 proximate to an interface of the SPAD 310 and the vertical gate structures 332, and isolates the SPAD 310 from the second regions 330 of the first semiconductor layer 318 on the opposite sides of the vertical gate structures 332 outside of the first region 328 in accordance with the teachings of the present invention.

In particular, as shown in the example, vertical gate structures 332 are surround SPAD 310 in first semiconductor layer 318 to isolate SPAD 310 from regions 330 outside of vertical gate structures 332. In one example, each vertical gate structure 310 includes a trench that is filled with doped polysilicon 334 disposed in the first semiconductor layer 318 proximate to the SPAD 310. The vertical gate structure 310 also includes a passivation layer 336 that lines the polysilicon filled trench. In one example, the passivation layer 336 includes $SiO_2$ or another suitable type of passivation. In another example, it can be a high-k dielectric film that is negatively charged. Passivation layer 336 is disposed between doped polysilicon 334 inside the trench and semiconductor material of the first semiconductor layer 318. Positive gate bias voltage +GATE BIAS 340 is coupled to the doped polysilicon 334 of vertical gate structures 332 to generate the depletion layer 338 in SPAD 310 as shown, which functions as a guard ring to isolate SPAD 310 in accordance with the teachings of the present invention. In particular, because the bulk of the epitaxial silicon of first semiconductor layer 318 is p type and biased with high negative operational voltage $-V_{OPT}$ 342 for SPAD 310 breakdown purposes, a slightly positive gate bias voltage +GATE BIAS 340 creates a very high potential difference between passivation layer 336 of vertical gate structure 332 and the p doped layer 322 in SPAD 310, which generates the depletion layer 338 between the p doped layer 322 in SPAD 310 and passivation layer 336 in accordance with the teachings of the present invention.

The depletion layer 338 provides several benefits. First, it ensures that the multiplication junction 326 does not extend out towards the perimeter of SPAD 310, which effectively provides a guard ring for SPAD 310, especially when negatively charged passivation 336 is used for reducing the effects that can be caused by defects in the trench sidewall oxide in passivation layer 336 of vertical gate structures 322. In addition, the positive biased vertical gate structure 332 can reduce the DCR. Thus, it is appreciated that with depletion layer 338 functioning as a guard ring as discussed, the biased vertical gate structures 332 have a smaller pitch compared with traditional doping guard ring designs, which enable SPAD arrays with higher pixel count, fill factor, and packing densities in accordance with the teachings of the present invention.

As summarized previously, the multiplication junction 326 is defined at the interface between n doped layer 324 and p doped layer 322 in the first region 328 of the first semiconductor layer 318. As mentioned, the semiconductor material of the first semiconductor layer 318 outside of the SPAD 310 is biased with a high negative operational voltage $-V_{OPT}$ 342 through a p+ doped region 346 as shown. As such, the multiplication junction 326 is reversed biased above a breakdown voltage such that photons directed into the SPAD 310 trigger an avalanche multiplication process in the multiplication junction 326. The output pulse generated as a result of the avalanche multiplication process in SPAD 310 can be sensed through the $+V_{EXCESS}$ terminal 344 coupled to the cathode of SPAD 310.

In the illustrated example, the SPAD 310 is formed proximate to a front side of the first semiconductor layer 318, and the SPAD 310 is optically coupled to receive incident photons/light 350 through a back side 348 of the first semiconductor layer 318. In one example, the incident photons/light 350 are included in infrared or near infrared light. Accordingly, in one example, the first semiconductor layer 318 is thinned to a thickness of approximately 6~10 µm to enable near infrared photons/light 350 to reach SPAD 310 through the back side 348 of thinned first semiconductor layer 318. In addition, electrons (e−) that are photogenerated in first semiconductor layer 318 by incident photons/light 350 entering through the back side 348 of first semiconductor layer 318 can also drift as shown through the p doped layer 322 to the reverse biased multiplication junction 326 to trigger the avalanche in SPAD 310 in accordance with the teachings of the present invention.

Figure 4:
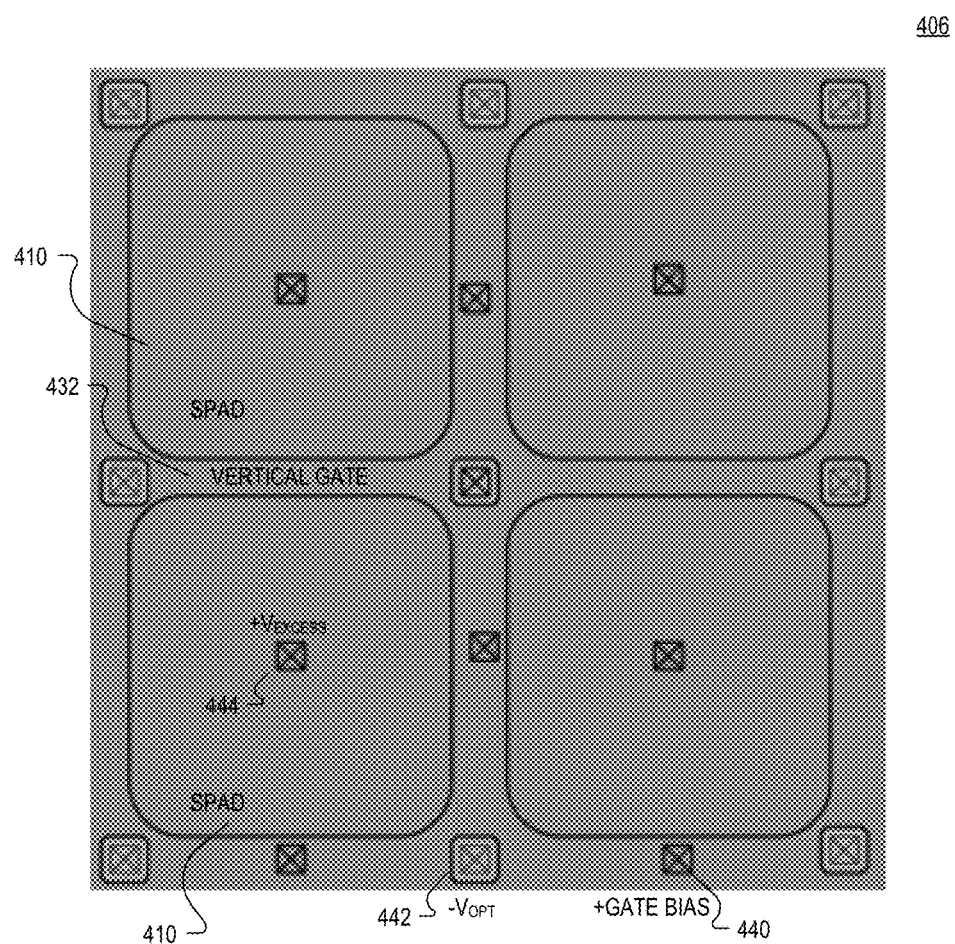
FIG. 4 is a top view of one example of a photon detection array with SPADs surrounded by vertical gate structures to provide guard ring isolation with reduced pitch and increased packing density in accordance with the teachings of the present invention.

FIG. 4 is a top view of one example of a photon detection array with SPADs 410 surrounded by vertical gate structures to provide guard ring isolation with reduced pitch and increased packing density in accordance with the teachings of the present invention. It is appreciated that SPADs 410 of FIG. 4 may be one example of an implementation of SPADs 110A, 110B, 110C of FIG. 1, or of $SPAD_A$ 210A, $SPAD_B$ 210B, $SPAD_C$ 210C, ... $SPAD_N$ 210N of FIG. 2, or of SPAD 310 of FIG. 3, and that similarly named and numbered elements referenced below are coupled and function similar to as described above. As shown in the depicted example, a photon detection array 406 includes a plurality of photon detection devices such as SPADs 410, which are arranged in an array. In the depicted example, each SPAD 410 is isolated in the semiconductor material from one another by a vertical gate 432. As shown in the depicted example, there are no sharp corners in SPADs 410. In the example, the bulk semiconductor material is biased with a high negative operational voltage $-V_{OPT}$ 442, and the vertical gate structures 432 are biased with a positive gate bias voltage +GATE BIAS 440 coupled to the vertical gate structures 432. In the example, output pulses generated as a result of the avalanche multiplication processes in SPADs 410 can be sensed through the $+V_{EXCESS}$ terminal 444 coupled to the cathode of each SPAD 410.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A photon detection device, comprising:
 a single photon avalanche diode (SPAD) disposed in a first region of a first semiconductor layer, wherein the SPAD includes a multiplication junction defined at an interface between an n doped layer and a p doped layer of the SPAD in the first region of the first semiconductor layer;
 a vertical gate structure disposed in the first semiconductor layer proximate to the SPAD, wherein the vertical gate structure surrounds the SPAD to isolate the SPAD in the first region of the first semiconductor layer from a second region of the first semiconductor layer on an opposite side of the vertical gate structure, wherein the n doped layer and the p doped layer of the SPAD laterally extend within the first region of the first semiconductor layer to contact the vertical gate structure; and
 a depletion layer generated around a perimeter of the SPAD at an interface of the vertical gate structure and the p doped layer in response to a gate bias voltage coupled to the vertical gate structure, wherein the depletion layer isolates the SPAD from the second region of the first semiconductor layer on the opposite side of the vertical gate structure.

2. The photon detection device of claim 1, wherein the vertical gate structure comprises:
 a doped polysilicon filled trench disposed in the first semiconductor layer proximate to the SPAD; and
 a passivation layer lining the doped polysilicon filled trench, wherein the passivation layer is disposed between the doped polysilicon inside the trench and semiconductor material of the first semiconductor layer.

3. The photon detection device of claim 2, wherein the gate bias voltage is a positive voltage coupled to the doped polysilicon inside the trench, wherein the semiconductor material of the first semiconductor layer outside of the SPAD is coupled to receive a negative operational bias voltage.

4. The photon detection device of claim 1, wherein the multiplication junction is reversed biased above a breakdown voltage such that photons directed into the SPAD trigger an avalanche multiplication process in the multiplication junction.

5. The photon detection device of claim 4, wherein the SPAD is formed in a front side of the first semiconductor layer, and wherein the SPAD is optically coupled to receive the photons through a back side of the first semiconductor layer.

6. The photon detection device of claim 5, wherein the photons are near infrared light directed through the back side of the first semiconductor layer into the SPAD.

7. The photon detection device of claim 1, wherein the first semiconductor layer is included in a first semiconductor device wafer, wherein the first semiconductor device wafer is stacked with a second semiconductor device wafer including support circuitry coupled to the SPAD, and wherein the first and second semiconductor device wafers are coupled together in a stacked chip system.

8. The photon detection device of claim 7, wherein the support circuitry included in the second semiconductor device wafer includes quenching circuitry and time to digital converter (TDC) circuitry coupled to the SPAD.

9. The photon detection device of claim 7, wherein the support circuitry included in the second semiconductor device wafer includes an application specific integrated circuit (ASIC) coupled to the SPAD.

10. The photon detection device of claim 1, wherein the depletion layer is generated only in the p doped layer of the SPAR at the interface of the vertical gate structure and the p doped layer.

11. A photon sensing system, comprising:
 a photon detection array having a plurality of photon detection devices, wherein each one of the photon detection devices includes:
  a single photon avalanche diode (SPAD) disposed in a first region of a first semiconductor layer, wherein the SPAD includes a multiplication junction defined at an interface between an n doped layer and a p doped layer of the SPAD in the first region of the first semiconductor layer;
  a vertical gate structure disposed in the first semiconductor layer proximate to the SPAD, wherein the vertical gate structure surrounds the SPAD to isolate the SPAD in the first region of the first semiconductor layer from a second region of the first semiconductor layer on an opposite side of the vertical gate structure, wherein the n doped layer and the p doped layer of the SPAD laterally extend within the first region of the first semiconductor layer to contact the vertical gate structure; and
  a depletion layer generated around a perimeter of the SPAD at an interface of the vertical gate structure and the p doped layer in response to a gate bias voltage coupled to the vertical gate structure, wherein the depletion layer isolates the SPAD from the second region of the first semiconductor layer on the opposite side of the vertical gate structure; and
 support circuitry coupled to the photon detection array to support operation of the photon detection array, wherein the support circuitry is disposed in a second semiconductor layer.

12. The photon sensing system of claim 11, wherein the first semiconductor layer is included in a first semiconductor device wafer, wherein the first semiconductor device wafer is stacked with a second semiconductor device wafer including the second semiconductor layer, and wherein the first and second semiconductor device wafers are coupled together in a stacked chip system.

13. The photon sensing system of claim 11, wherein the vertical gate structure comprises:
   a doped polysilicon filled trench disposed in the first semiconductor layer proximate to the SPAD; and
   a passivation layer lining the doped polysilicon filled trench, wherein the passivation layer is disposed between the doped polysilicon inside the trench and semiconductor material of the first semiconductor layer.

14. The photon sensing system of claim 13, wherein the gate bias voltage is a positive voltage coupled to the doped polysilicon inside the trench, wherein the semiconductor material of the first semiconductor layer outside of the SPAD is coupled to receive a negative operational bias voltage.

15. The photon sensing system of claim 11, wherein the multiplication junction is reversed biased above a breakdown voltage such that photons directed into the SPAD trigger an avalanche multiplication process in the multiplication junction.

16. The photon sensing system of claim 15, wherein the SPAD is formed in a front side of the first semiconductor layer, and wherein the SPAD is optically coupled to receive the photons through a back side of the first semiconductor layer.

17. The photon sensing system of claim 11, wherein the support circuitry disposed in the second semiconductor layer includes quenching circuitry and time to digital converter (TDC) circuitry coupled to the photon detection array.

* * * * *